United States Patent
Liou et al.

(10) Patent No.: US 9,400,435 B2
(45) Date of Patent: Jul. 26, 2016

(54) METHOD OF CORRECTING OVERLAY ERROR

(71) Applicant: UNITED MICROELECTRONICS CORP., Hsin-Chu (TW)

(72) Inventors: En-Chiuan Liou, Tainan (TW); Chia-Chang Hsu, Kaohsiung (TW); Teng-Chin Kuo, Taipei (TW); Chia-Hung Wang, Taichung (TW); Tuan-Yen Yu, Tainan (TW); Yuan-Chi Pai, Tainan (TW); Chun-Chi Yu, Taipei (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 55 days.

(21) Appl. No.: 14/457,136

(22) Filed: Aug. 12, 2014

(65) Prior Publication Data

US 2015/0362905 A1      Dec. 17, 2015

(30) Foreign Application Priority Data

Jun. 17, 2014   (CN) .......................... 2014 1 0270347

(51) Int. Cl.
| | |
|---|---|
| *G03F 7/20* | (2006.01) |
| *G03F 9/00* | (2006.01) |
| *G05B 19/18* | (2006.01) |
| *G03F 1/42* | (2012.01) |

(52) U.S. Cl.
CPC ........ *G03F 7/70633* (2013.01); *G03F 7/70491* (2013.01); *G05B 19/188* (2013.01); *G03F 1/42* (2013.01); *G05B 2219/45027* (2013.01); *G05B 2219/45031* (2013.01)

(58) Field of Classification Search
CPC ... G03F 1/42; G03F 7/70633; G03F 7/70491; G05B 19/188; G05B 2219/45027; G05B 2219/45031
USPC ....................................................... 430/22, 30
See application file for complete search history.

(56) References Cited

U.S. PATENT DOCUMENTS

| | | | |
|---|---|---|---|
| 7,268,360 B2 * | 9/2007 | Smith .................... | B82Y 10/00 250/548 |
| 7,317,824 B2 | 1/2008 | Ghinovker | |
| 7,474,401 B2 * | 1/2009 | Ausschnitt .......... | G03F 7/70633 356/401 |
| 8,421,040 B2 * | 4/2013 | Takekoshi .............. | B82Y 10/00 250/492.1 |

* cited by examiner

*Primary Examiner* — Christopher Young
(74) *Attorney, Agent, or Firm* — Winston Hsu; Scott Margo

(57) ABSTRACT

A method of correcting an overlay error includes the following steps. First, an overlay mark disposed on a substrate is captured so as to generate overlay mark information. The overlay mark includes at least a pair of first mark patterns and at least a second mark pattern above the first mark patterns. Then, the overlay mark information is calculated to generate an offset value between two first mark patterns and to generate a shift value between the second mark pattern and one of the first mark patterns. Finally, the offset value is used to compensate the shift value so as to generate an amended shift value.

21 Claims, 5 Drawing Sheets

METHOD OF CORRECTING OVERLAY ERROR

BACKGROUND OF THE INVENTION

1. Field of the Invention

The present invention relates generally to the field of semiconductor manufacturing processes, and more particularly to a method of correcting overlay error in photolithographic processes.

2. Description of the Prior Art

Photolithography is an essential step in semiconductor manufacturing processes, through which the pattern of integrated circuits may be transferred from photomasks to semiconductor chips. Generally, a design layout of integrated circuit provided by an IC design house may be divided into several layers of design layouts after it is received by the semiconductor manufacturing company. These design layouts may be then fabricated on the corresponding transparent plates to thereby form photomasks with desired layouts. The layout of each of the photomasks may be respectively transferred to a photoresist layer on the chip through suitable photolithographic process. Afterwards, other suitable processes, such as etching, deposition, doping and so forth may be carried out in order to obtain required semiconductor devices.

Recently, the measurement of the overlay between two or more successive layers becomes more and more important as the continuous miniaturization in integrated circuits. For instance, through vias and contacts are often used to electrically connect interconnections in different layers to one another. Because the interconnections, the through vias and/or the contacts are generally disposed in different layers, a process of overlay measurement needs to be carried out during each of the corresponding photolithographic processes so as to assure the minimum shift between successive layers.

However, the current overlay measurement still has some drawbacks. For example, due to measurement deviation, the measured values of relative positions between successive layers often fail to reflect their real positions. Therefore, the measurement results often include overlay error.

Accordingly, there is a need to provide an improved method of correcting overlay error so as to increase the accuracy of the measurement results.

SUMMARY OF THE INVENTION

In light of the above, the embodiments of the present invention disclose a method of correcting overlay error so as to eliminate the overlay error in current overlay measurement.

A method of correcting an overlay error according to one embodiment of the present invention is disclosed and includes the following steps. First, an overlay mark disposed on a substrate is captured so as to generate overlay mark information. The overlay mark includes at least a pair of first mark patterns and at least a second mark pattern above the first mark patterns. Then, the overlay mark information is calculated to generate an offset value between two first mark patterns and to generate a shift value between the second mark pattern and one of the first mark patterns. Finally, the offset value is used to compensate the shift value so as to generate an amended shift value.

Another method of correcting overlay error according to another embodiment of the present invention is also disclosed and includes the following steps. First, an overlay mark on a substrate is detected so as to generate overlay mark information. The overlay mark includes first mark patterns disposed in a first layer of the substrate and at least two second mark patterns disposed in a second layer different from the first layer. Then, the overlay mark information is calculated to generate offset values between each two of the first mark patterns and to generate deviation values between each of the second mark patterns and each of the first mark patterns. Finally, each of the offset values is used to compensate each of the deviation values to generate corrected deviation values.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
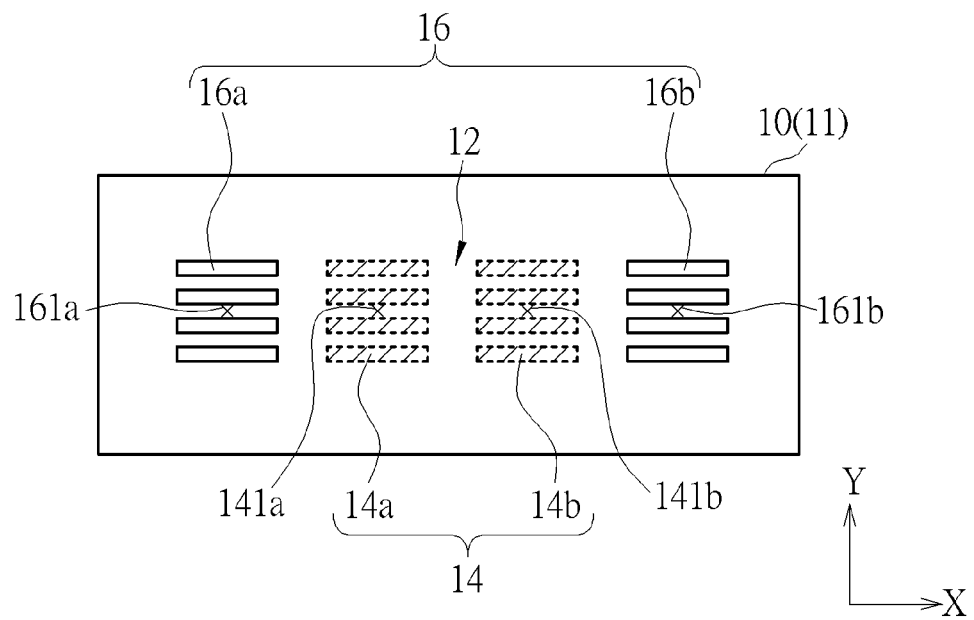
FIG. 1 is a schematic diagram showing an overlay mark on a photomask according to one embodiment of the present invention.

In the following description, numerous specific details are given to provide a thorough understanding of the invention. It will, however, be apparent to one skilled in the art (note: of ordinary skill in the art) that the invention may be practiced without these specific details. Furthermore, some well-known system configurations and process steps are not disclosed in detail, as these should be well-known to those skilled in the art.

Likewise, the drawings showing embodiments of the apparatus are not to scale and some dimensions are exaggerated for clarity of presentation. Also, where multiple embodiments are disclosed and described as having some features in common, like or similar features will usually be described with same reference numerals for ease of illustration and description thereof.

FIG. 1 is a schematic diagram showing an overlay mark on a photomask according to one embodiment of the present invention. An overlay mark 12 includes a plurality of overlay mark patterns 14 and 16 disposed on different photomasks 10 and 11. For example, the overlay mark 12 includes first mark patterns 14a and 14b and second mark patterns 16a and 16b. Both the first and the second mark patterns may be designed to have grid structures. In this case, the first mark patterns 14, while the second mark patterns 16 are disposed on a second photomask 11. Preferably, both the first and the second mark patterns 14 and 16 may be arranged along the same axis, such as along a Y-axis, but is not limited thereto.

Overlay mark 12 may be used to detect a possible overlay shift between the circuit patterns in consecutive layers occurring in the subsequent manufacturing processes. In particular, the first and the second mark patterns 14 and 16 may be respectively transferred to different layers on the semiconductor substrate through the following manufacturing processes. The relative positions of the first and the second mark patterns on the semiconductor substrate may be measured to check the alignment of the corresponding circuit patterns. In addition, a reference axis or a reference point parallel to the X-axis may be respectively defined in each of the first and the second mark patterns 14 and 16. For example, the central positions 141a, 141b, 161a and 161b of the first and the second mark patterns 14 and 16 may be used as reference points, which may act as measurement basis in the following measurement process. As shown in FIG. 1, the central positions 141a, 141b, 161a and 161b may be fixed to have the same Y value. However, the central position 141a, 141b, 161a and 161b may be set to respectively have unequal Y values.

In the following paragraphs, consecutive pattered layers including the first and the second mark patterns and a method for determining overlay between these consecutive pattered layers are disclosed.

Figure 2:
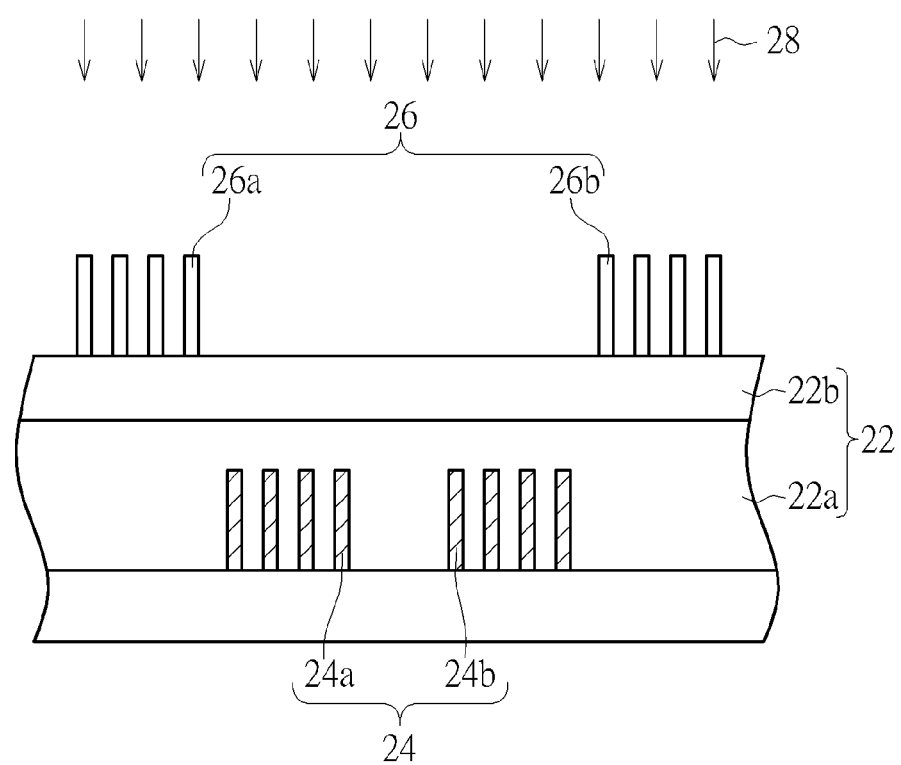
FIG. 2 is a schematic cross-section diagram showing the first and the second mark patterns transferred to different layers on a substrate.

FIG. 2 is a schematic cross-section diagram showing the first and the second mark patterns transferred to different layers on a substrate. It should be noted that FIG. 2 is merely used to show the relationship between the mark patterns in different layers. Therefore, the structure shown in FIG. 2 is not directly taken form the structure shown in FIG. 1. As shown, through suitable photolithography, etching, deposition and planarization, the first mark patterns 14 and the second mark patterns 16 may be sequentially transferred from the first photomask 10 and the second photomask 11 to the semiconductor substrate 18. In this way, the first mark patterns 24 are disposed below the second mark patterns 26. In particular, the first mark patterns 24 may be used to calibrate the position of gate structures in a device region of the semiconductor substrate 18, while the second mark patterns 26 may be used to calibrate the position of contact structures in the device region of the semiconductor substrate 18. Through this calibration, the gate structures and the contact structures may be preciously aligned. Additionally, a stack layer 22, such as monolayer or multilayer, may be disposed on the semiconductor substrate 18. According to this embodiment, the stack layer 22 is a multilayer including a first layer 22a, such as interlayer dielectric, and a second layer 22b, such as mask layer, but not limited thereto. In this arrangement, the first mark patterns 24a and 24b are embedded in the first layer 22a and the second mark patterns 26a and 26b are disposed on the second layer 22b. It should be noted that the first and the second mark pattern disclosed above may also be formed on another suitable substrate different from the semiconductor substrate. For example, they may be formed on a plastic substrate, glass substrate and so forth.

Afterwards, a detection step, such as a diffraction based overlay (DBO) step or an image based overlay (IBO) step, may be performed to measure the first mark patterns 24 and the second mark patterns 26 and to thereby generate the corresponding overlay mark information. The overlay mark information is further described in the following paragraphs.

Figure 3:
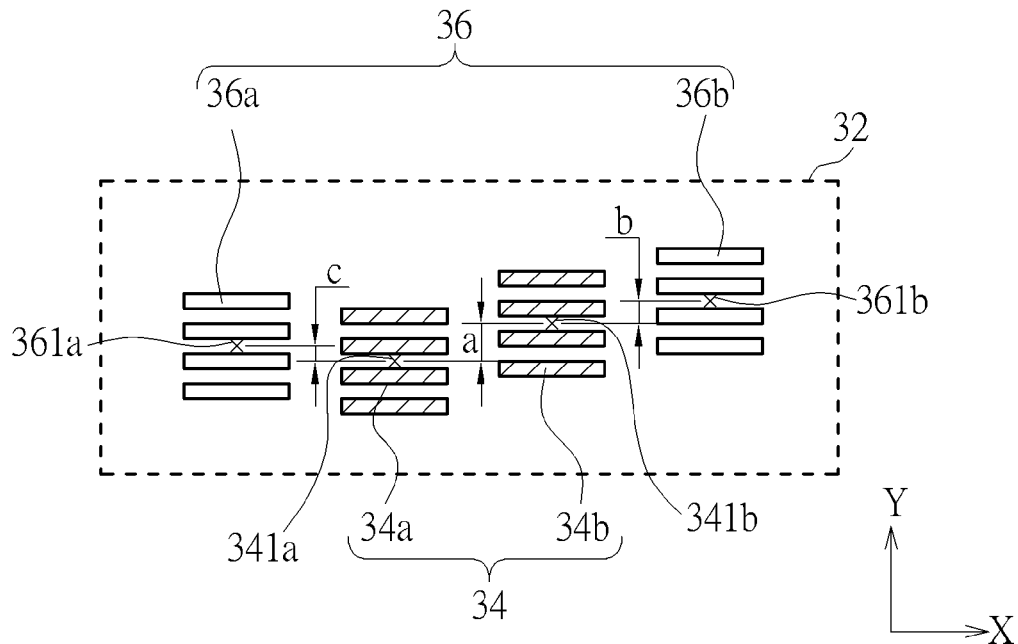
FIG. 3 is a schematic diagram showing overlay mark information generated through a detection process.
Figure 4:
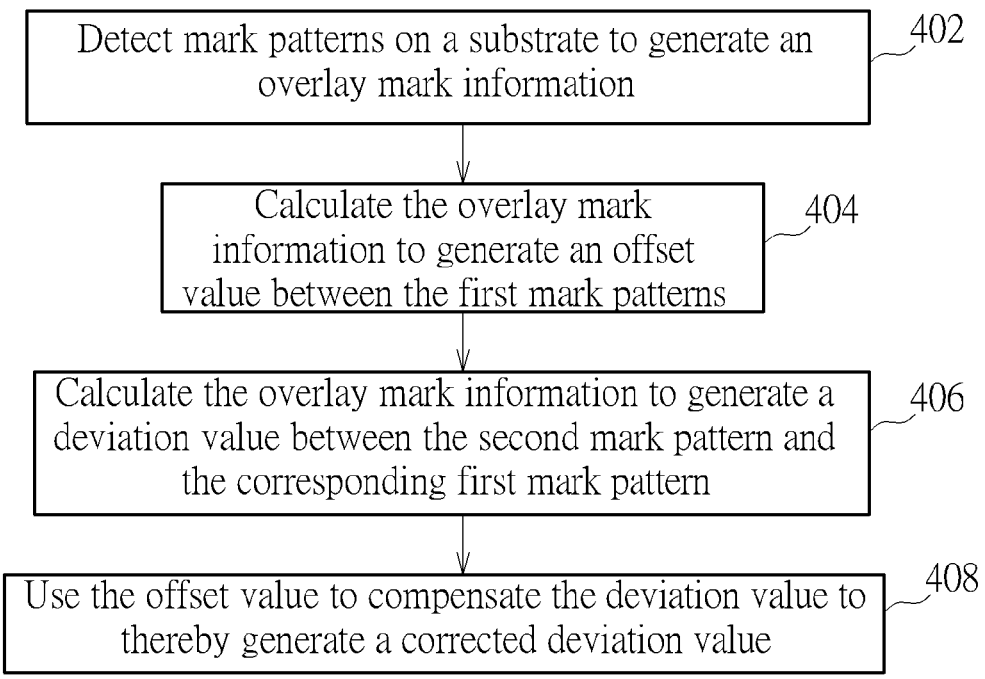
FIG. 4 is a simplified flow chart of a detection process according to one embodiment of the present invention.

FIG. 3 is a schematic diagram showing overlay mark information about the first mark pattern and the second pattern. FIG. 4 is a simplified flow char according to one embodiment of the present invention. When step 402 is accomplished, an overlay mark information 32 shown in FIG. 3 is generated. In this case, the overlay mark information 32 may be an image file including first mark patterns 34a and 34b and the second mark patterns 36a and 36b, which may be stored in an electronic form in a computer readable media. Generally, the relative shift between the circuit patterns in successive layers may be determined by measuring and calculating the relative positions of the central positions 341a, 341b, 361a and 361b of the first mark patterns 34a, 34b and those of the corresponding second mark patterns 36a and 36b. However, because of inherent detection error in detection tool, such as error induced by the difference in the refractive index of dielectric layers, the measurement result is often deviated from the real situation if only the central positions of the first mark patterns 34a and 34b and those of the corresponding second mark pattern 36a and 36b are measured.

Therefore, in order to eliminate this random deviation due to the difference in the refractive indexes, the overlay mark information 32 may be calculated to generate an offset value along a certain axis between the two first mark patterns 34a and 34b and to generate a deviation value along the certain axis between each of the second mark patterns 36a and 36b and at least one of the first mark patterns 34a and 34b. Afterwards, the deviation value may be compensated by the offset value and a corrected deviation value along the certain axis is thereby obtained.

For example, as shown in FIG. 1 and FIG. 3, in step 404, an offset value in the Y-axis between the central positions 341a and 341b of the first mark patterns may be generated by calculating the overlay mark information 32. Afterwards, in step 406, deviation values b and c in the Y-axis between each of the central positions 361a and 361b of the second mark patterns and each of the central positions 341a and 341b of the first mark patterns may be generated by calculating the overlay mark information 32. In the absence of the error induced by photolithographic and deposition processes, the offset should be mainly from the detection tool due to there is no offset or deviation between the original first mark patterns 14a and 14b. In order to eliminate this detection error, in step 408, the offset value a may be divided by a certain weight, such as divided by 2, and then be used to compensate deviation values b and c. For example, the offset value divided by the certain weight may be respectively added to the deviation values b and c so as to generate corrected deviation values in Y-axis. The compensation process may be shown as equation (1) below:

$$\text{corrected deviation value} = (\text{offset value}/\text{weight}) + \text{deviation value} \quad \text{equation (1)}$$

Furthermore, the offset value a and deviation values b and c preferably have directions. That is, these values may be quantities involving directions as well as magnitudes. For example, the offset value a has an offset direction, and the deviation values b and c have a deviation direction parallel to the offset direction, such as +Y direction or −Y direction. When the offset direction is opposite to the corresponding deviation direction, one of the offset value and the corresponding deviation value is a positive real number and the other one is a negative real number; when the offset direction is the same as the corresponding deviation direction, both the offset value and the deviation value are positive real numbers. For example, as shown in FIG. 3, for the second mark pattern 36a and the corresponding first mark pattern 34a, the offset direction is −Y direction, while the corresponding deviation direction is +Y direction. Therefore, one of the offset value a and the deviation value b is a positive real number and the other one is negative real number. Similarly, for the second mark pattern 36b and the corresponding first mark pattern 34b, the offset direction is +Y direction, and the deviation direction is also +Y direction. Therefore, both the offset value a and the corresponding deviation value b are positive real numbers.

For the sake of clarity, the central positions of the mark patterns may be used as reference points for measuring the relative shift between mark patterns in different layers. However, there may be another way for measuring the relative shift between mark patterns in different layers according to another embodiment of the present invention. For example, the measurement may be carried out by using a diffraction tool to determine diffraction orders of the first mark patterns and the second mark patterns. The diffraction orders may be further calculated to thereby determine the relative shift between the mark patterns in different layers. It should be noted that, in either ways, the offset value have to be applied to compensate the deviation value so as to generate the corrected deviation value.

Figure 5:
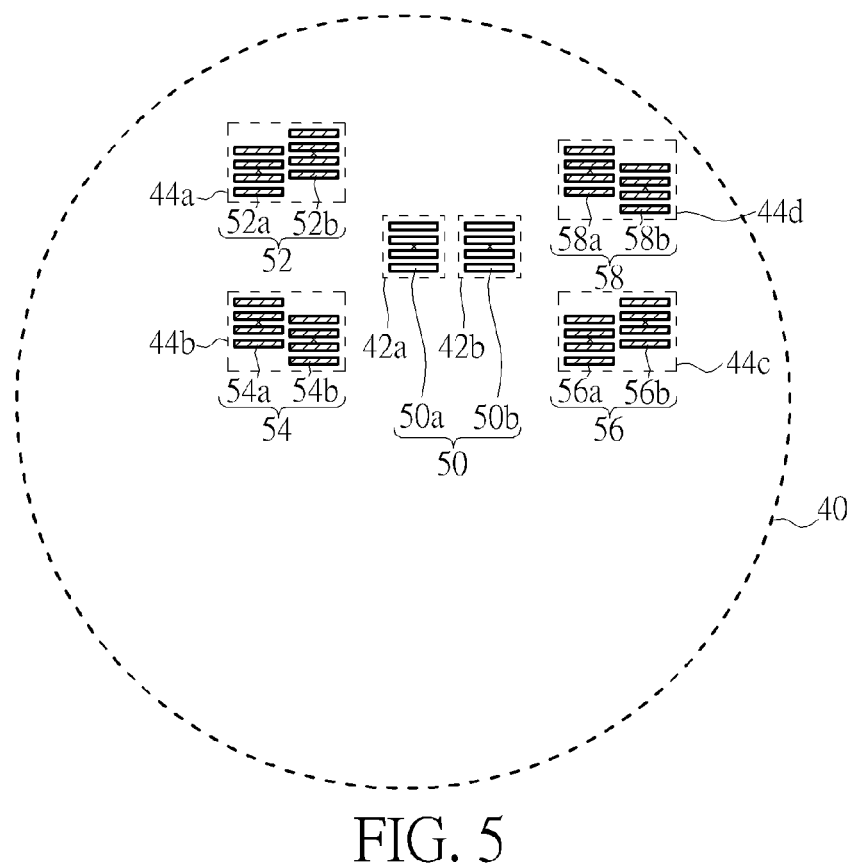
FIG. 5 is a schematic diagram showing overlay mark information including a plurality of first mark patterns and at least two second mark patterns according to another embodiment of the present invention.

The pattern of the overlay mark may be modified according to another embodiment of the present invention. FIG. 5 is a schematic diagram showing overlay mark information including several first mark patterns and at least two second mark patterns. The overlay mark information 40 includes a plurality of first mark patterns 52, 54, 56 and 58 and at least two second mark patterns 50, which are respectively disposed in the corresponding working zones, such as disposed in the first to the sixth working zone 42a, 42b, 44a, 44b, 44c and 44d. The first mark patterns 52, 54, 56 and 58 may be disposed in a relatively deep layer on the semiconductor substrate, also called previous layer, while the second mark pattern 50 may be disposed in a relatively shallow layer on the semiconductor substrate, also called current layer, but is not limited thereto.

Figure 6:
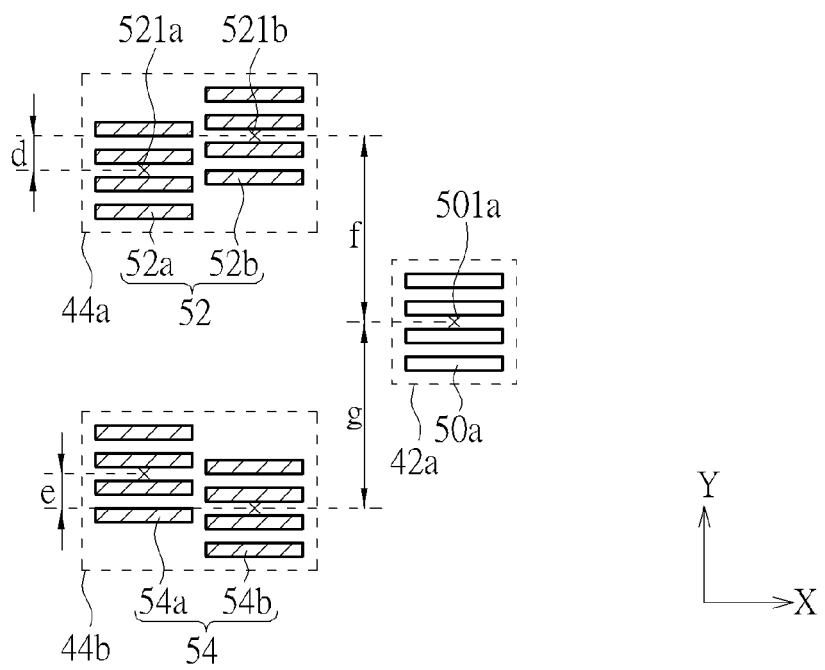
FIG. 6 is a schematic diagram partially showing a first mark pattern and a second mark pattern of the overlay mark information shown in FIG. 5.

FIG. 6 is a schematic diagram partially showing a first mark pattern and a second mark pattern of overlay mark information shown in FIG. 5. Similarly, in order to eliminate the random deviation of the positions of the first mark patterns 52 and 54 due to the difference in the refractive indexes, the overlay mark information 40 may be calculated to generate an offset value along a certain axis between the two first mark patterns 52a and 52b and to generate a deviation value along the certain axis between the second mark patterns 50a and the corresponding first mark patterns 52a and 52b. Afterwards, the deviation values f and g may be compensated by the offset values d and e to thereby generate a corrected deviation value along the certain axis.

In particular, the overlay mark information 40 may be calculated to generate offset values d and e along Y-axis respectively between the central positions 521a and 521b of the first mark patterns and between the central positions 541a and 541b of the first mark patterns. Then, the overlay mark information 40 is calculated to generate deviation values f and g along Y-axis respectively between the central position 501a of the second mark pattern and the central positions 521b and 541b of the first mark patterns. Finally, the offset values d and e may be respectively divided by a certain weight, such as 2, and the result is used to compensate the corresponding deviation values f and g. For example, the offset values d and e divided by the certain weight may be added to the deviation values f and g to thereby generate corrected deviation values along Y-axis. The compensation process may be shown as equations (2) and (3) below:

corrected deviation value=f+d/2    equation (2)

corrected deviation value=g+e/2    equation (3)

In another case, the offset values d and e may be averaged first to generate an averaged offset value. The averaged offset value may be further divided by a certain weight, such as 2, and the result is respectively added to the deviation values f and g so as to generate a corrected deviation value along Y-axis. The compensation process may be shown as equations (4) and (5) below:

corrected deviation value=f+(d+e)/4    equation (4)

corrected deviation value=g+(d+e)/4    equation (5)

Similarly, the offset values d and e and deviation values f and g also involve directions. That is, these values may be quantities involving directions as well as magnitudes. These characteristics are omitted for the sake of clarity.

Figure 7:
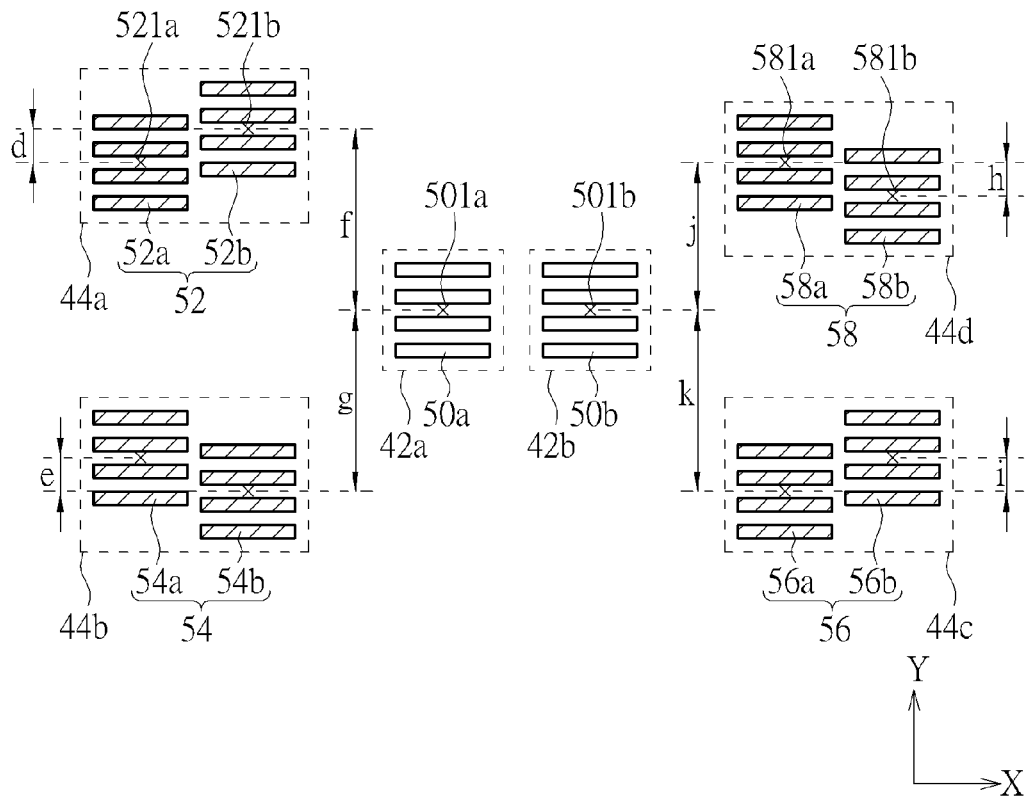
FIG. 7 is a schematic diagram showing a first mark pattern and a second mark pattern of the overlay mark information shown in FIG. 5.

FIG. 7 is a schematic diagram showing a first mark pattern and a second mark pattern of overlay mark information shown in FIG. 5. According to this embodiment, the positions of the second mark patterns 50a and 50b may be respectively corrected by the corresponding first mark patterns 52, 54, 56 and 58. In particular, the overlay mark information 40 may be calculated to generate offset values I and h respectively between the central position 561a and 561b of the first mark patterns and the central positions 581a and 581b of the first mark patterns. In addition, the overlay mark information 40 is further calculated to generate deviation values k and j respectively between the central position 501b and the central positions 561a and 581a of the first mark pattern. Afterwards, offset values d, e, h and i are averaged to generate an averaged value. The averaged value may be divided by a certain weight, such as 2, and then be respectively added to the deviation values f, g, j and k to thereby generate corrected deviation values, but is not limited thereto. Similarly, the offset values d, e, h and i and deviation values f, g, j and k also involve directions. That is, these values may be quantities involving directions as well as magnitudes. These characteristics are omitted for the sake of clarity.

In the previous embodiment, as shown in FIG. 1, the first mark pattern 14a and 14b of the first photomask 10 have mirror symmetry. That is, there is no Y-axis offset between them. However, there may be a relative shift with a predetermined offset value defined between the first mark patterns 14a and 14b. This arrangement is disclosed in the following paragraphs.

Figure 8:
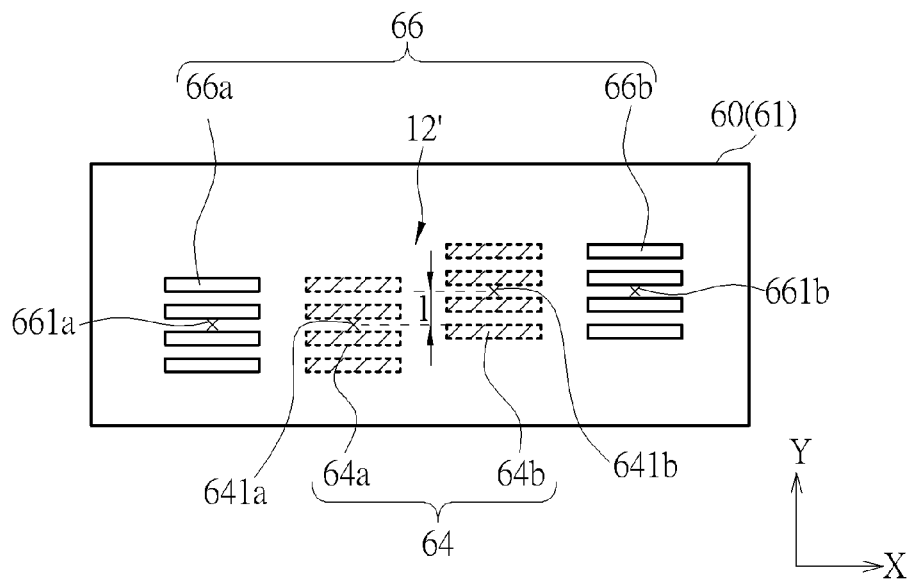
FIG. 8 is a schematic diagram showing an overlay mark of a photomask according to still another embodiment of the present invention.

FIG. 8 is a schematic diagram showing an overlay mark on a photomask according to another embodiment of the present invention. An overlay mark 12' includes a plurality of overlay mark patterns 64 and 66 with grid structures. The overlay mark patterns 64 and 66 are respectively disposed on photomasks 10 and 11. In this case, the first mark patterns 64a and 64b are disposed on the first photomask 60, while the second mark pattern 66a and 66b are disposed on the second photomask 11. Preferably, both the first and the second mark patterns 64 and 66 may be arranged along the same direction, such as along a Y-axis, but is not limited thereto. In addition, there is a relative shift between the first mark patterns 64a and 64b so that there is a predetermined offset value l between two of the central positions 641a and 641b.

Figure 9:
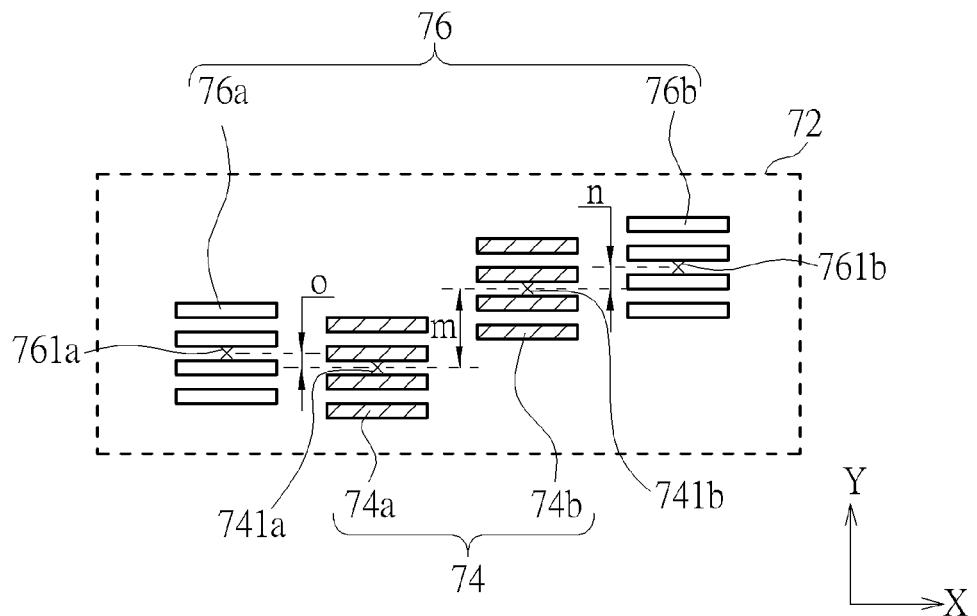
FIG. 9 is a schematic diagram showing overlay mark information generated through a detection process.

FIG. 9 is a schematic diagram showing overlay mark information generated through a detection process. In this case, overlay mark information 72 may be an image file including first mark patterns 74a and 74b and the second mark patterns 76a and 76b, which may be stored in an electronic form in a computer readable media. One of the characteristics of the present embodiment is that, because the predetermined offset value l is originally defined between the first mark pattern 64*a*, 64*b* on the first photomask 60, the offset value m between the first mark patterns 74*a* and 74 needs to be subtracted from the predetermined offset value l before the process for correcting the deviation values o and n between the central positions 741*a* and 741*b* of the first mark pattern and the central positions 761*a* and 761*b* of the second mark pattern. The corrected offset value may be further divided by a certain weight, such as 2, and then added to the corresponding deviation values o and n. In this way, a corrected deviation value along Y-axis may be generated. The compensation process may be shown as equations (6) and (7) below:

$$\text{corrected deviation value}=n+(m-1)/2 \quad \text{equation (6)}$$

$$\text{corrected deviation value}=o+(m-1)/2 \quad \text{equation (7)}$$

Similarly, the offset value m and deviation values o and n also involve directions, these characteristics are omitted for the sake of clarity.

Figure 10:
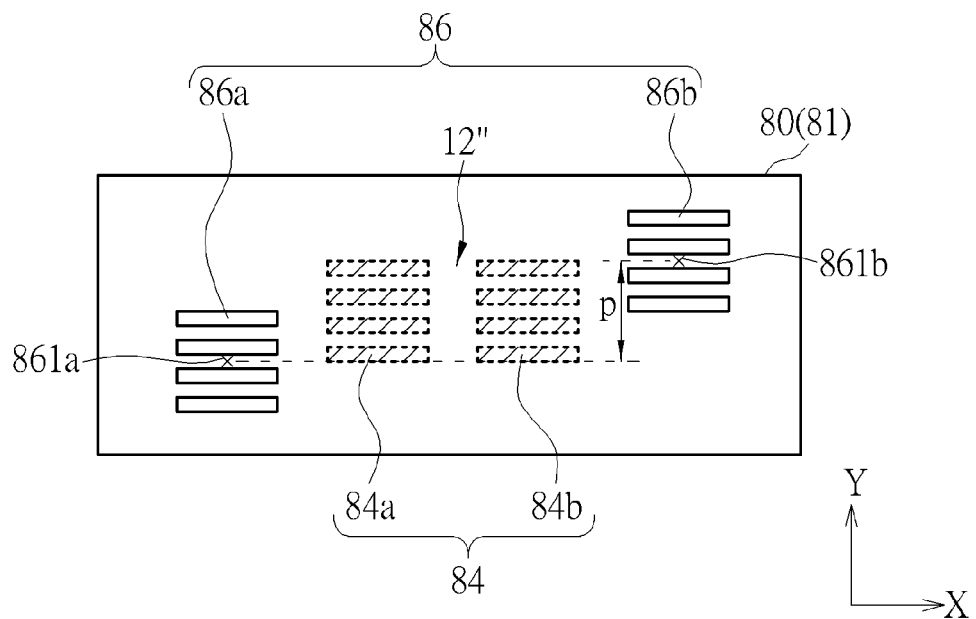
FIG. 10 is a schematic diagram showing an overlay mark on a photomask according to still another embodiment of the present invention.

According to still another embodiment of the present invention, there may be a relative shift with a predetermined offset value defined between the second mark patterns. This arrangement is disclosed in the following paragraphs. FIG. 10 is a schematic diagram showing an overlay mark on a photomask according to still another embodiment of the present invention. In particular, an overlay mark 12" includes a plurality of overlay mark patterns 84 and 86 with grid design. The overlay mark patterns 84 and 86 are respectively disposed on photomasks 80 and 81. In this case, the first mark patterns 84*a* and 84*b* are disposed on the first photomask 80, while the second mark pattern 86*a* and 86*b* are disposed on the second photomask 81. Preferably, both the first and the second mark patterns 84 and 86 may be arranged along the same axis, such as along a Y-axis, but is not limited thereto. In addition, there is a relative shift between the second mark patterns 66*a* and 66*b* so that there is a predetermined offset value p defined between two of the central positions 841*a* and 841*b*.

Afterwards, the first and the second patterns 84 and 86 may be sequentially transferred to the substrate. Then, the corresponding information may be generated by detecting the first and the second patterns 84 and 86 by performing a detection process. A correction process is further carried out to generate a corrected deviation value between the first and the second patterns.

In sum, the embodiments of the present invention disclose a method for correcting overlay error. During this correction process, an offset value of the lower mark pattern is used to compensate or calibrate a deviation value between the lower and the upper mark patterns and thereby generate a corrected deviation value. Hence, the detection error caused by the difference in the refractive indexes may be eliminated. Accordingly, the accuracy of the overlay measurement is enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A method of correcting overlay error, comprising:
   detecting an overlay mark on a substrate to generate an overlay mark information, wherein the overlay mark comprises:
   at least a pair of first mark patterns disposed in a first layer on the substrate, wherein the first mark patterns are periodic structures; and
   at least a second mark pattern disposed in a second layer different from the first layer, wherein the second mark pattern is periodic structure and the second layer is on the substrate;
   calculating the overlay mark information to generate an offset value between the first mark patterns;
   calculating the overlay mark information to generate a deviation value between the second mark pattern and at least one of the first mark patterns, wherein the deviation value has a deviation direction; and
   using the offset value to compensate the deviation value so as to generate a corrected deviation value, wherein the offset value has an offset direction parallel to the offset direction.

2. The method according to claim 1, wherein each of the first mark patterns consists of grid structure.

3. The method according to claim 2, wherein the first mark patterns are arranged in a same direction.

4. The method according to claim 1, wherein the step of generating the offset value comprises:
   capturing an image of each of the first mark patterns, wherein each of the images has a central position; and
   measuring a distance between two of the central positions.

5. The method according to claim 1, wherein when the offset direction is opposite to the deviation direction, one of the offset value and the deviation value is a positive real number and the other one is a negative real number.

6. The method according to claim 1, when the offset direction is same to the deviation direction, both the offset value and the deviation value are positive real numbers.

7. The method according to claim 1, wherein the step of generating the corrected deviation value comprises:
   dividing the offset value by a weight; and
   adding the offset value divided by the weight to the deviation value.

8. The method according to claim 7, wherein the step of dividing the offset value by a weight is a step of averaging the offset value.

9. The method according to claim 1, wherein a distance between the first mark patterns has a predetermined offset value.

10. The method according to claim 9, wherein the step of generating the corrected deviation value comprises:
   subtracting the predetermined offset value from the offset value to generate a corrected offset value; and
   dividing the corrected offset value by a weight;
   adding the corrected offset value divided by the weight to the deviation value.

11. The method according to claim 1, wherein the overlay mark further comprises a pair of further first mark patterns disposed in the first layer, the further first mark patterns are disposed in a direction same as a direction of the second mark pattern.

12. The method according to claim 11, further comprising:
   calculating the overlay mark information to generate an offset value between the further first mark patterns; and
   using the offset value between the further first mark patterns to compensate the deviation value.

13. The method according to claim 12, wherein the step of using the offset value to compensate the deviation value comprises:
   averaging two of the offset values so as to generate an averaged offset value; and
   adding the averaged offset value to the deviation value.

14. A method of correcting overlay error, comprising:
  detecting an overlay mark on a substrate so as to generate an overlay mark information, wherein the overlay mark comprises:
    a plurality of first mark patterns disposed in a first layer of the substrate; and
    at least two second mark patterns disposed in a second layer different from the first layer, wherein the second layer is on the substrate;
  calculating the overlay mark information to generate offset values between each two of the first mark patterns;
  calculating the overlay mark information to generate deviation values between each of the second mark patterns and each of the first mark patterns; and
  using each of the offset values to compensate each of the deviation values so as to generate corrected deviation values.

15. The method according to claim 14, wherein the first mark patterns are arranged in a same direction.

16. The method according to claim 14, wherein the offset value has an offset direction and the deviation value has a deviation direction, when the offset direction is opposite to the deviation direction, one of the offset value and the deviation value is a positive real number and the other one is a negative real number.

17. The method according to claim 14, wherein the step of generating the corrected deviation values comprises:
  summing each of the offset values so as to generate a summed offset value; and
  dividing the summed offset value by a weight after summing each of the offset values.

18. The method according to claim 17, wherein the step of dividing the summed offset value by a weight is a step of averaging the summed offset value.

19. The method according to claim 14, wherein the step of generating the corrected deviation values comprises:
  averaging the offset values so as to generate at least two averaged offset values;
  dividing each of the averaged offset value by a weight; and
  adding each of the averaged offset value divided by the weight to each of the deviation values.

20. The method according to claim 14, wherein a distance between two of the first mark patterns has a predetermined offset value.

21. The method according to claim 20, wherein the step of generating the corrected deviation values comprises:
  subtracting the predetermined offset from the offset value so as to generate a corrected offset value; and
  dividing the corrected offset value by a weight; and
  adding the corrected offset value divided by the weight to the deviation value.

* * * * *